US005500618A

United States Patent [19]

Comer

[11] Patent Number: 5,500,618

[45] Date of Patent: Mar. 19, 1996

[54] OPERATIONAL FUNCTION GENERATOR

[75] Inventor: Donald T. Comer, Middletown, Pa.

[73] Assignee: Oak Industries Inc., Waltham, Mass.

[21] Appl. No.: 314,520

[22] Filed: Sep. 29, 1994

[51] Int. Cl.[6] .............................. G06G 7/42; H03H 11/26

[52] U.S. Cl. .......................... 327/361; 327/262; 327/317; 327/378

[58] Field of Search .................................... 327/262, 317, 327/361, 378

[56] References Cited

U.S. PATENT DOCUMENTS 5,381,359 1/1995 Abbott et al. ...................... 364/724.19

*Primary Examiner*—Margaret Rose Wambach

*Attorney, Agent, or Firm*—Michael L. Harrison

[57] ABSTRACT

A novel compensation device for conditioning or generating signals to have an arbitrarily defined shape, produced to an arbitrarily specified accuracy. The device comprises a plurality of bounded polynomial function generators having outputs summed into a summing network to produce a signal which is the composite of the effects of all of the polynomial generators. Accuracy is achieved through the use of fusible link trimming of the compensation circuits, which are configured to provide mathematically well-behaved polynomial functions with predictable responses to the programming, and which produce effects only over desired segments of the range of interest. The result is a monotonic signal with no discontinuities, which can be made arbitrarily close to a specified signal.

7 Claims, 6 Drawing Sheets

OPERATIONAL FUNCTION GENERATOR

BACKGROUND OF THE INVENTION

1. Field of the Invention

The present invention relates to electronic circuitry, and more particularly to apparatus for compensating electronic circuits which produce as undesired variation of output in response to the change in a variable, such as temperature, requiring that some form of compensation be provided in order to achieve a required level of accuracy in the desired output signal.

2. Prior Art

A need exists in many areas of electronic signal processing, conditioning and generation, for improvement in the accuracy of a particular signal. Because the basic mechanisms of conduction in almost all electronic devices are somewhat affected by temperature, the most common contributor to inaccuracy due to environmental variables is the change in temperature to which the device is exposed. Other effects may also need to be taken into account, however, such as the non-linearity of circuits due to common mode effects, power supply drift, or device inherent non-linearities.

Examples of circuits which are particularly susceptible to inaccuracies due to temperature change include precision voltage references, timing delay generators, and precision frequency oscillators. In all such cases, without some attention to controlling and compensating for the change of output signal characteristics due to temperature, the desired accuracy of the signal attribute of interest may not be met.

As a result of the need for higher and higher accuracy in certain electronic circuits in recent years, compensation of temperature induced errors is today widely used, and more precision in compensation has been required. Compensation techniques can generally be separated into analog circuit and mixed circuit methods. Analog methods utilize only analog circuit techniques, while mixed signal methods may employ a combination of analog and digital circuits.

As an example of a purely analog method known to the prior art, it is well known to combine the effects of circuit parameters which have a positive temperature coefficient with those which have a negative temperature coefficient. An example of the application of such a technique is the use of a current derived from a source which is deliberately chosen to have a positive temperature coefficient to provide the bias current for a P-N junction, which junction has an inherently negative temperature coefficient of voltage. For constant bias current conditions, as the temperature increases, the voltage tends to decrease across the P-N junction. However, if the bias current is made to vary positively with temperature increases, the decrease which would otherwise occur, due to the temperature coefficient of the voltage across the P-N junction, tends to be offset by the increase in the bias current which occurs with the same temperature increases. If the coefficients were to be perfectly matched in their magnitudes, a condition which never occurs in the real world of course, the combination would produce a net temperature coefficient of zero. Although the theoretically perfect compensation cannot be achieved in practice, the technique can markedly improve the temperature performance of many types of circuits. Such a method finds wide application in a variety of integrated circuit voltage references. See for example R. J. Widlar's "New Development in IC Voltage Regulators", *IEEE J. Solid-State Circuits,* SC-6, 2–7, Feb. 1971.

Sometimes a temperature effect is due to an indirect consequence of phenomena other than the conduction mechanism being influenced by temperature. One example of such an effect is the temperature dependency of the frequency of oscillation of crystal oscillators, wherein the mechanical properties of the crystal change with temperature, in turn causing a change in the oscillation frequency. Another example is that of resistors of certain compositions, wherein the mechanical distortion of the resistive element itself causes a change in its conduction.

Because it is often important to have a high degree of accuracy and stability of signal frequencies, temperature compensation is often applied to crystal oscillators. The use of polynomial generators for curve fitting and temperature compensation is well known for this purpose and in fact is the subject of "An Improved Method of Temperature Compensation of Crystal Oscillators" and U.S. Pat. No. 4,560,959 by Rokos and Wilson. This type of compensation scheme uses full-range polynomial functions, usually only first, second and third order, which overlap the same range as the range of interest of the circuit to be compensated.

Another form of curve fitting that has been used in the past for temperature compensation, is a "piece-wise linear" approach, in which the curve to be approximated is broken down into various segments or temperature intervals and the best linear curve fit is provided between each segment.

An example of compensation done by purely analog methods is the generation of compensation signals for a quartz crystal oscillator as described in James S. Wilson's "An Improved Method of Temperature Compensation of Crystal Oscillators", *IEEE J. Solid-State Circuits,* SC-6, 2–7, Feb. 1971.

In general, analog methods may be combined with "threshold" circuits which limit their compensation signals to certain temperature ranges. However, these remain basically analog methods. See, for example, Ueno et. al., U.S. Pat. No. 5,004,998. A drawback of the system described by Ueno is that the compensation signal is effectively "added" to the circuit, and remains a part of it for all times. Thus, the compensation signal itself may become a source of temperature dependency which must be taken into account as a source of error, and which itself may require further compensation.

FIG. 12 is a block diagram of a mixed-signal temperature compensation system, found in the prior art, which employs both analog and digital components. A system of this type is described in Marvin E. Frerking's "Crystal Oscillator Design and Temperature Compensation", Van Nostrand Reinhold Co., New York, N.Y., 1978. The mixed-signal system employs an analog voltage thermometer 1 feeding an analog to digital (A/D) converter 2, which in turn addresses a read only memory (ROM) 3. The output of the ROM, which is a digital word is then applied to a digital to analog (D/A) converter 4 which in turn generates the compensation signal. The analog voltage thermometer (AVT) 1 contains a heat sensing element (such as a P-N junction) which undergoes the same environmental heating as the device to be compensated. It is then expected to respond with an output signal which is directly proportional to temperature. FIG. 2 illustrates a typical output for the AVT.

The system of FIG. 12 can be used to generate any arbitrary compensation signal by programming the appropriate codes into the ROM. For example, as temperature increases, a change occurs in the digital code at the output of the A/D convertor. Within the inherent limitations of the system, each temperature produces a unique code at the output of the A/D converter 2. Each code in turn will address a unique memory cell within the ROM. The digital data stored at that cell can be programmed to produce any desired compensation signal at the output of the D/A convertor 4 by appropriate selection of digital bits.

Although systems such as the one illustrated in FIG. 12 are practical, and generally can be made more accurate than analog compensation systems, they suffer from the inherent limitation that they produce quantized correction signals. This means that if a compensation signal change is programmed to occur between two specific temperatures, when the correction occurs it will be abrupt. Such an abrupt or quantized correction is unacceptable in applications which depend on a continuous output. For example, in certain communication applications, the frequency of oscillation of a precision quartz oscillator must exhibit a continuous phase. A quantized temperature correction manifests itself as an instantaneous phase error in the oscillator output, which can lead to data errors in the communication system.

SUMMARY OF THE INVENTION

There is therefore need for a method of signal compensation which can generate any arbitrarily specified compensation signal, without introducing any discontinuities or quantizing errors. This type of compensation signal is described as "continuous" to distinguish it from compensation signals which occur abruptly.

The present invention accomplishes this and other objects by providing a configuration of multiple analog circuits arranged in such a way that precise correction signals may be generated, controlled and summed together in such a manner as to approximate any continuous specified correction signal. The device can provide conditioning or generating of signals having an arbitrarily defined shape, produced to an arbitrarily specified accuracy, by providing a plurality of bounded polynomial function generators having outputs all of which are summed into a summing network to produce a signal which is the composite of the effects of all of the polynomials. Each generator may be adjusted by use of fusible link trimming of the compensation circuits. The individual polynomial generators are designed to produce mathematically well-behaved polynomial functions with predictable responses to the programming, and which produce effects only over desired segments of the range of interest. The result is a monotonic signal with no discontinuities, which can be made arbitrarily close to the desired signal.

An important feature of the present invention is that the contribution of any individual compensation circuit has an effect only in the temperature range of interest for which it is programmed. Outside of that range, it has no effect, thereby eliminating the circuit itself as a potential source of error. In the preferred embodiment described, the fusible link trimming allows "field programmability," allowing correction approximations to be made on a trial and error or iterative basis to achieve the required accuracy for a given application.

The method of the present invention is referred to as "piece-wise polynomial" approximation in that it utilizes a series of polynomial curves, within certain preset temperature intervals, to accomplish the desired approximation. An earlier form of curve fitting that has been used in the past for temperature compensation, is a "piece-wise linear" approach, in which the curve to be approximated is broken down into various segments or temperature intervals and the best linear curve fit is provided between each segment.

The piece-wise polynomial method of approximation presented in this invention is distinctly different than either the prior art piece-wise linear or polynomial methods but has some factors in common with both.

The present invention is based upon the fact that a particular type of approximation signal, referred to herein as a "bounded polynomial" can be used to efficiently approximate an arbitrary correction function f(T) over any finite range of temperatures. Because of the properties of the bounded polynomial function, successive approximations may be added, to reduce the approximation error to any practical level, without introducing additional errors in the approximations achieved in prior iterations.

The discovery of the proper type of approximation function and the method of choosing the function are a key part of this invention as well as the discovery of the integrated circuits that can implement the required functions to achieve the desired compensation result.

DETAILED DESCRIPTION OF THE PREFERRED EMBODIMENT

Figure 1:
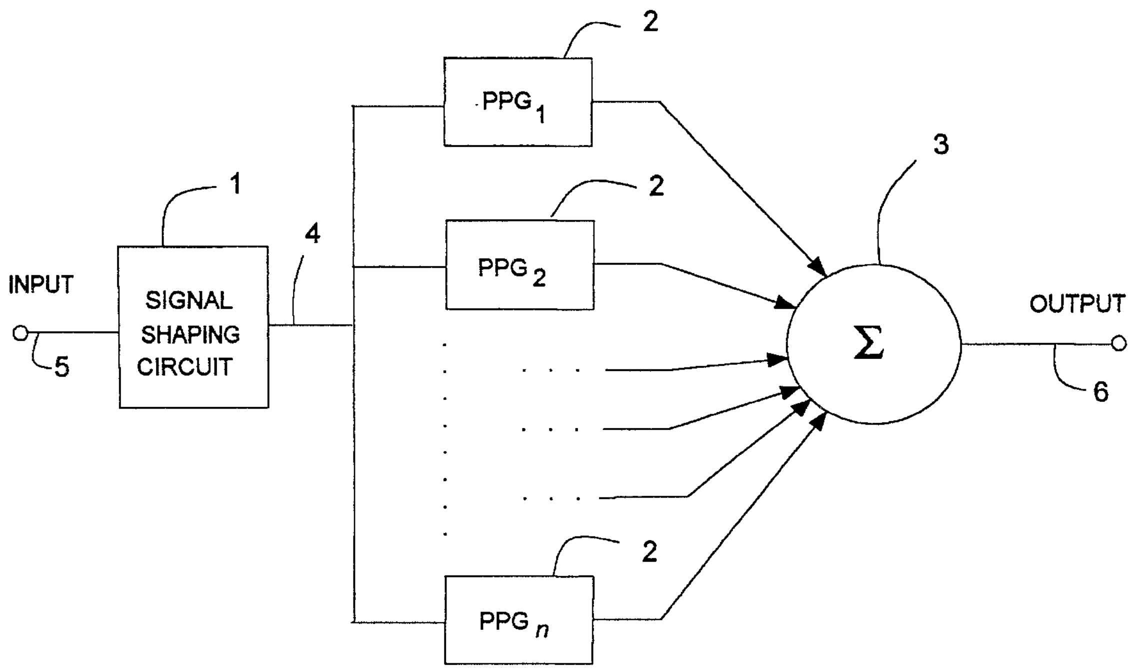
FIG. 1 shows a block diagram in its most general form of an operational function generator in accordance with the present invention.

FIG. 1 shows in generalized block diagram form the most general configuration of an operational function generator in accordance with the present invention, comprising signal shaping circuit 1, plurality of piece-wise polynomial generators ("PPGs") 2, (replicated n times as 1 through n), and summing network 3. This diagram illustrates the operation of the device in general, without regard to the type of signal from which the output is to be derived.

It will be appreciated by those skilled in the art, that the principles taught can be applied to many types of signals. Indeed, the device can be used as a basic function generator, which can be applied to a variety of signal conditioning or signal generating needs. For example, a logarithmic output function may be generated corresponding to a linear input voltage, for analog computation, waveform generation, and the like. As a signal conditioner, the device may be applied to compensate inherent non-linearities in the characteristics of, for example, sensor devices.

In operation, a signal input, perhaps in the form of an analog signal which has been generated either by some other function generating circuit, or by a sensor, is applied to the input 5 of the signal shaping circuit 1, which provides isolation between the signal source and the present device. The signal shaping circuit 1 may also provide amplification, polarity changing, level shifting, and the like, as may be dictated by the requirements of the specific application.

The conditioned signal, at the output 4 of the signal shaping circuit 1 is applied to all inputs of the piece-wise polynomial generators 2. The function of each PPG 2 is similar, and will be described in more detail below. For the present, the function of the generators is to contribute a specific signal to the summing network 3. Each generator is preset to contribute a segment of input to the summing network 3, which will in turn cause a contribution to be made to the composite signal which will be produced at the output 6 of the summing network 3.

In the case of each generator 2, the function which is generated at its output will be the result of preselecting several characteristics: the level of the input signal at which the circuit begins to be effective; the level of the input signal beyond which it becomes ineffective; the polarity of its contribution; and the magnitude of its contribution.

Figure 3:
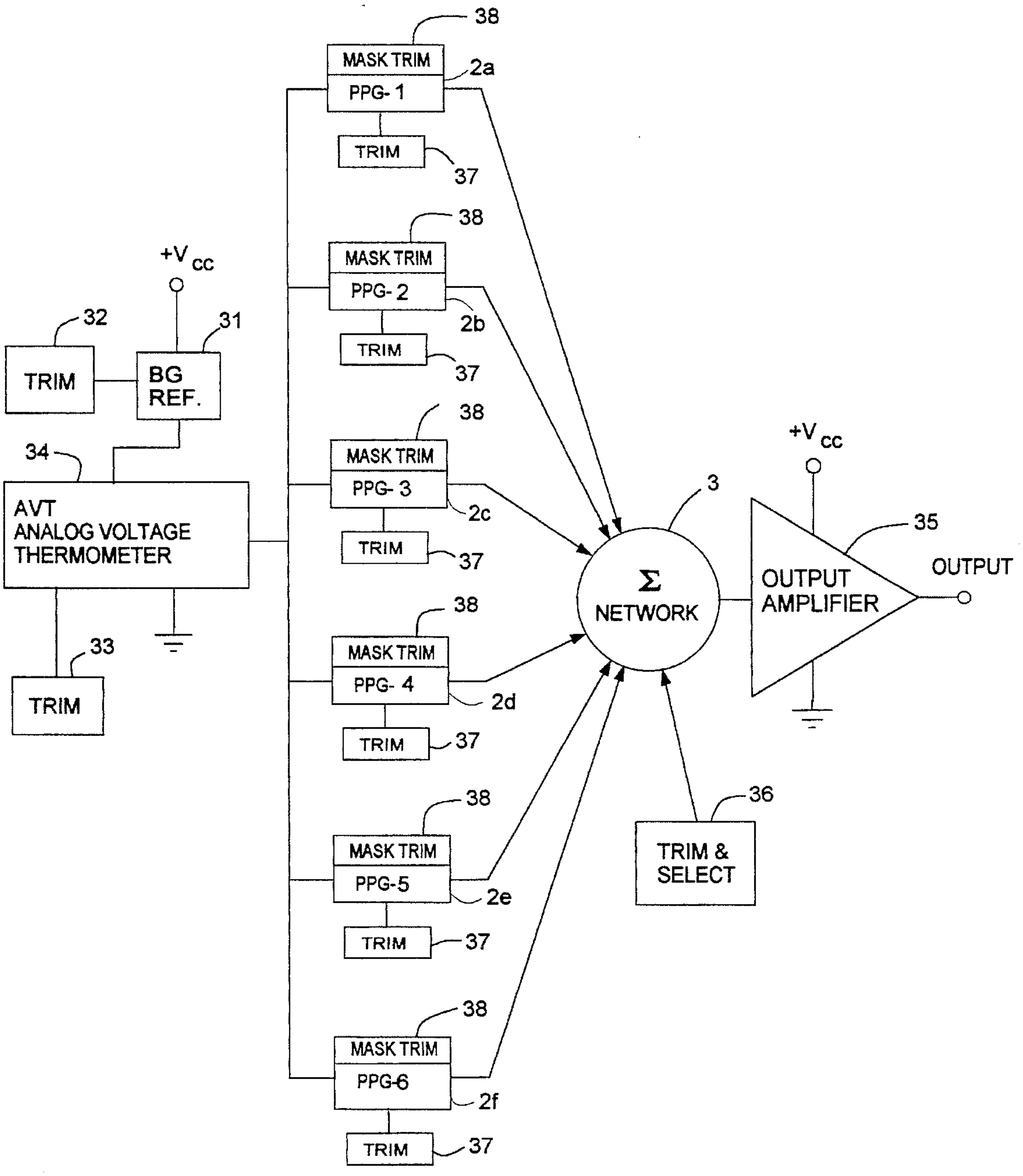
FIG. 3 shows a block diagram representing the signal compensation device of this invention.
Figure 4:
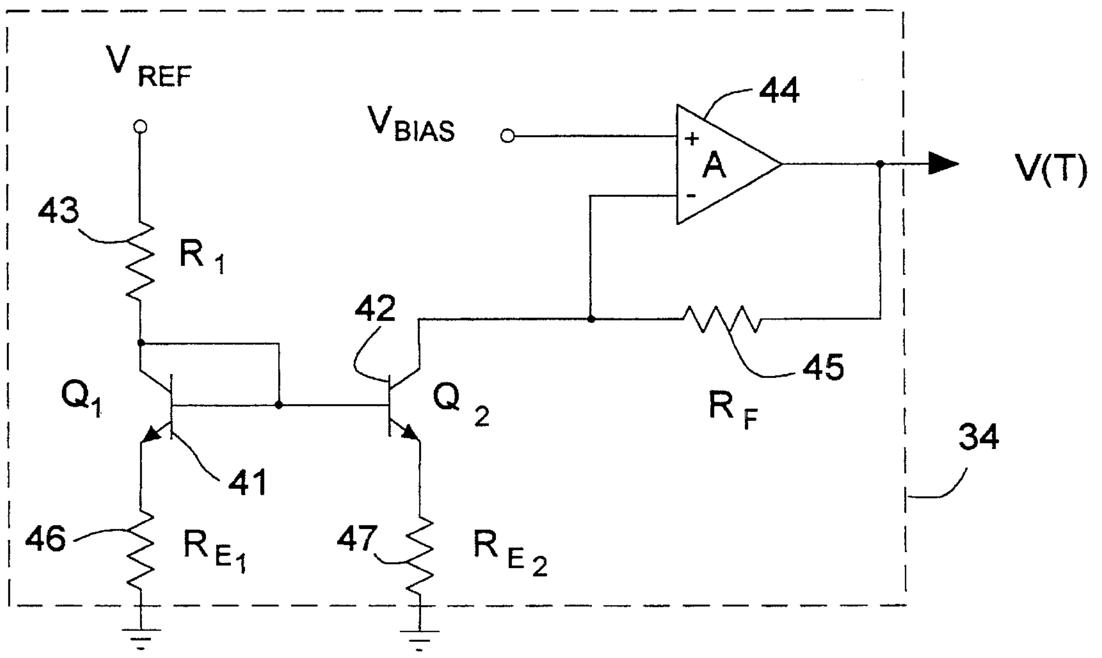
FIG. 4 shows one possible circuit implementation of an analog voltage thermometer.

For illustration, compensation of an analog voltage thermometer ("AVT") is now described. A device suitable for such compensation is shown in FIG. 3. A sensor suitable for use as an AVT is shown in FIG. 4. The device itself consists of a precision reference voltage 31 whose function is to generate a bias voltage which is stable with temperature, and which may itself employ any analog compensation techniques required, using prior art methods, an analog voltage thermometer (AVT) 34, as previously described, a group of several PPG's 2, circuits *2a*, *2b*, *2c*, *2d*, *2e*, and *2f*. (FIG. 3 shows 6 such circuits, however more or less may be required for particular embodiments), a summing network 3, an output buffer amplifier 35, and a trim and select network 36. Each PPG 2 is associated with a mask trim circuit 38 which provides initial preselection of the desired characteristics of the particular PPG with which the mask trim 38 is associated, specifically: the level of the input signal at which the PPG begins to be effective; the level of the input signal beyond which the PPG becomes ineffective; and the polarity and magnitude of the particular PPG's contribution to the composite signal. The values of the mask trim circuit would typically be selected at the time of manufacture of the function generator. In addition, each of the first 6 elements are augmented by a manual trim circuit 37 which is configured to provide a means of fine adjustment, after manufacture, of critical resistor values for each circuit with which it is employed.

Figure 2:
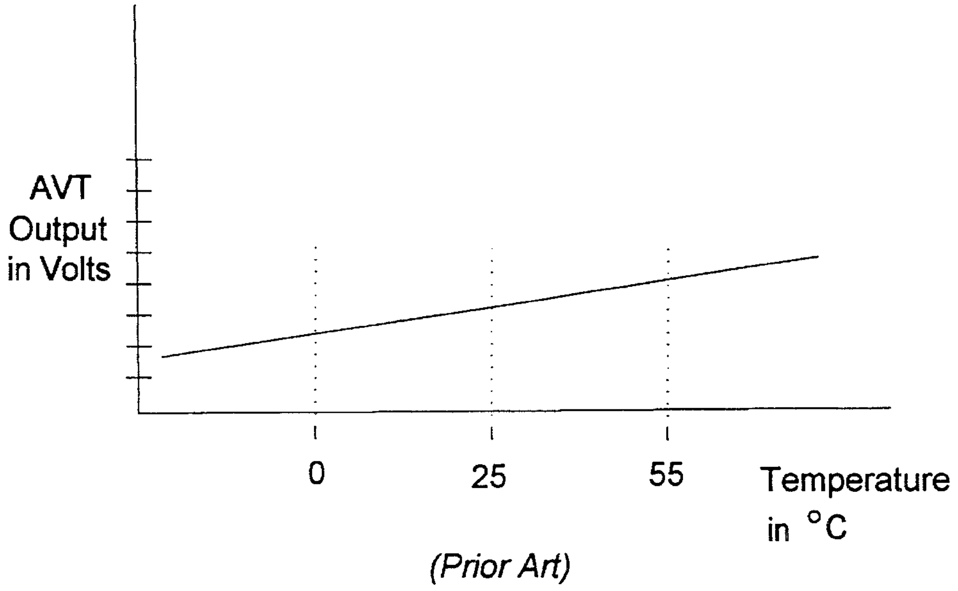
FIG. 2 shows a typical output characteristic for an analog voltage thermometer, as is known in the prior art.

FIG. 4 shows one possible implementation of an AVT circuit which will produce the required voltage-temperature characteristic shown in FIG. 2. The circuit consists of a current mirror formed by transistors $Q_1$ (41), and $Q_2$ (42), and resistors $R_{E1}$ (46), and $R_{E2}$ (47). The input or reference current for the mirror circuit is provided from a fixed voltage $V_{REF}$ connected through resistor $R_1$. The output current of the current mirror, which is the collector current of $Q_2$, is converted to a voltage $V_O$ by the op-amp 44 and feedback resistor $R_F$, 45. The input (reference) current to the current mirror will increase linearly with temperature, as the base-emitter junction drop decreases. The base-emitter junction drop for a typical bipolar integrated circuit device such as $Q_1$ will decrease at a rate of about 2 mV per degree centigrade. A corresponding increase in v(T) will be present, causing v(T) to rise with temperature approximately as depicted in FIG. 2. A general discussion of current mirrors, P-N junction temperature behavior and op-amp performance is contained in any recent integrated circuits textbook. For example, see A. B. Grebene's "Bipolar and MOS Analog Integrated Circuit Design", John Wiley and Sons, New York, 1984, Chapter 4. The general equation for the output voltage as a function of temperature v(T) for the AVT circuit may be expressed as $$v(T)=kT+V_{BIAS}$$

where k is a proportionality constant, T is temperature in degrees Kelvin and $V_{BIAS}$ is a dc bias level. The bias level $V_{BIAS}$ and the slope K can be accurately adjusted by proper choice of $R_1$ (43), and $R_F$ (45), $R_{E1}$ (46), $R_{E2}$ (47), $V_{REF}$, and $V_{BAIS}$.

Figure 5:
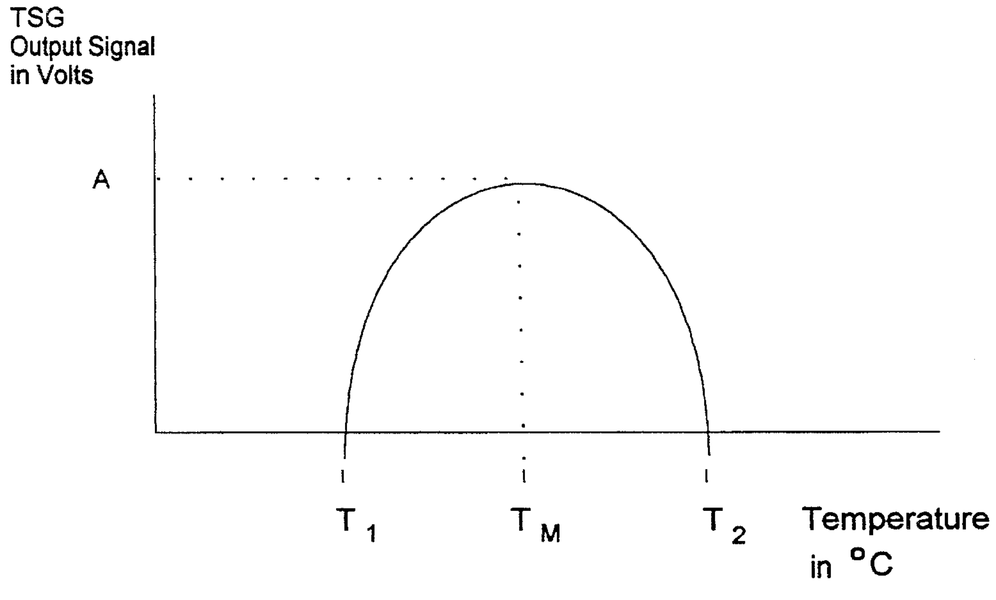
FIG. 5 shows a typical output from an operational function generator in accordance with the present invention, adapted for temperature signal compensation (known as a bounded polynomial).

The function of each PPG 2 (*2a–2f*) in the circuit of FIG. 3 i}Yto fenerate an output signal in response to the AVT which has general characteristics as shown in FIG. 5. This function is referred to as a "bounded parabolic" function. Its characteristics are summarized as follows:

1. The output should be zero at values of input corresponding to or less than temperature $T_1$, called the "cut-in" temperature
2. The output should be zero at values of input corresponding to or greater than temperature $T_2$, called the "cut-out" temperature
3. For inputs corresponding to an AVT signal between temperatures $T_1$ and $T_2$ the output should be a well defined and behaved function of temperature with no discontinuities and should show a maximum output at some temperature $T_M$.

The function of the trim circuit for each PPG 2 is to provide fine adjustments on the cut-in and cut-out temperatures $T_1$ and $T_2$.

The function of the summing network 3 of FIG. 3 is to sum together the signals from the various PPG's 2 and at the same time to provide an adjustable weighting function for each PPG 2 signal, so that its amplitude may be adjusted relative to the other PPG's 2.

Figure 6:
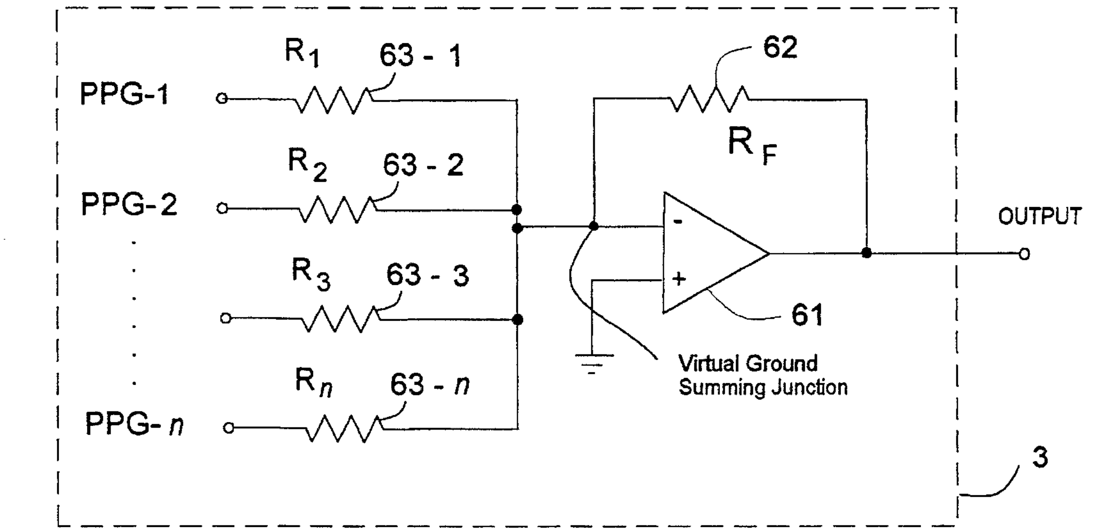
FIG. 6 shows one possible circuit implementation for the summing amplifier of FIG. 3.

FIG. 6 shows a schematic representation of a summing network 3 which can be used to implement the function required in the circuit of FIG. 3. In this case a virtual ground or summing junction is created by the use of the op-amp 61 and the feedback resistor 62. Signals from the various PPG's 2 are then summed into the summing junction and weighted depending upon the value of associated summing resistor 63, referred to by their position in the network as 63-1, 63-2, 63-3, and 63-n.

Trimming of the summing resistors 63 for each PPG 2 signal may be accomplished by either laser trim or "zener zap" methods. For example see Comer, D. T., U.S. Pat. No. 4,777,471. The zener zap method is preferred in applications where field programmability is important and therefore zener zap trim is considered the preferred method of trim for the invention.

Figure 7:
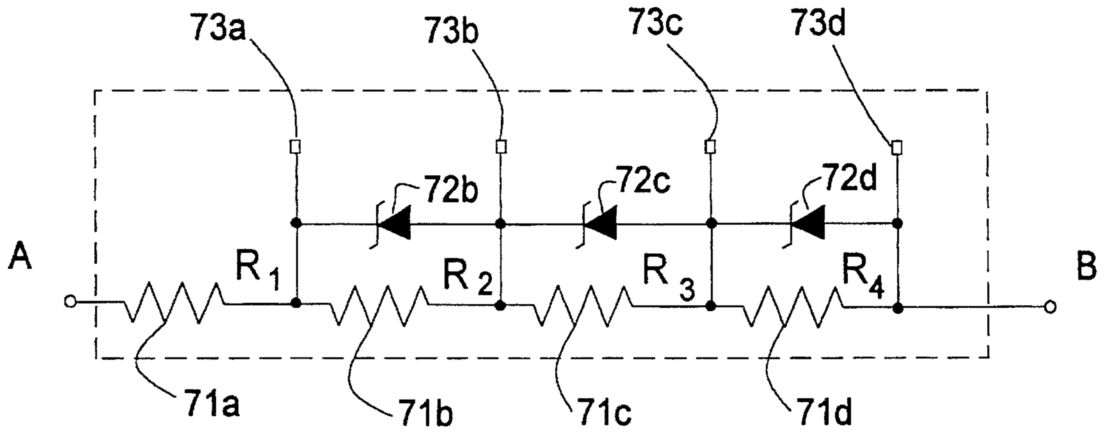
FIG. 7 shows a typical "zener zap"-trimmed resistor such as is known to the prior art.

FIG. 7 shows a summing resistor 63 useful for summing a PPG 2 signal into the summing network 3, and having a provision for adjustment of the resistor value after manufacture. The total resistance between the terminals A and B of the resistors is made up of 4 resistor links 71*a*, 71*b*, 71*c*, and 71*d* which may be of various values. Some number of the links may be shunted by a zener diode P-N junction 72*a*, 72*b*, 72*c*, and 72*d* as illustrated. Access to each terminal of the zener diodes is provided by bonding pads 73*a*, 73*b*, 73*c*, and 73*d* also illustrated. By applying a proper polarity voltage between two of the bonding pads, a selected zener can be made to become a permanent short circuit, thus shorting out its associated resistor link and reducing the total series resistance of the sum resistor. The selection of link sizes and design of the trim network based upon range and resolution of the trim required may be carried out as described in prior art.

Figure 8:
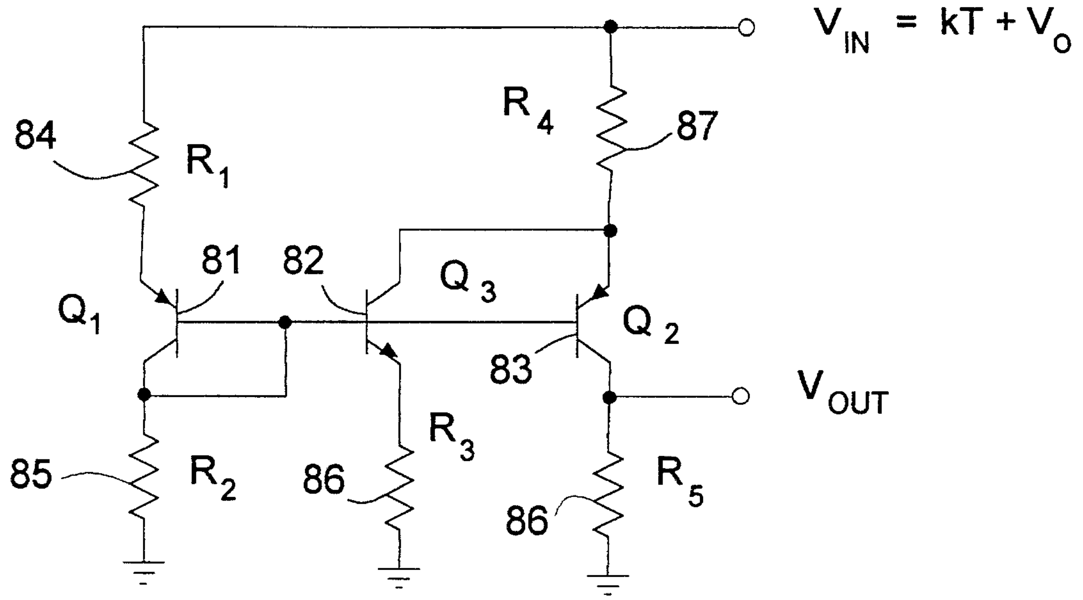
FIG. 8 shows a possible implementation of a bounded polynomial temperature signal generator circuit.
Figure 9:
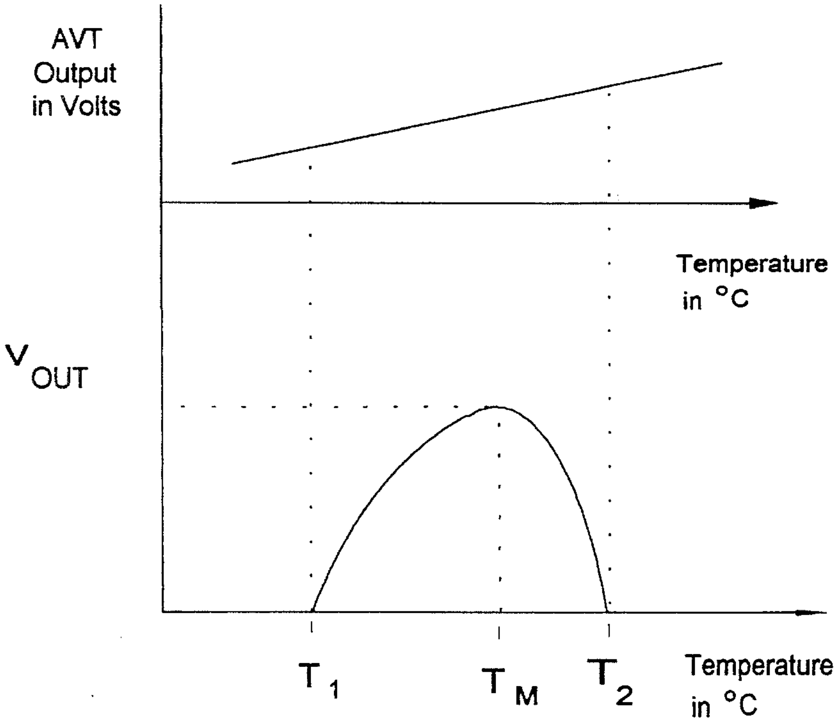
FIG. 9 shows a typical output signal from the circuit of FIG. 8.

FIG. 8 illustrates one possible PPG 2 circuit that can be used in the embodiment of FIG. 3. The circuit of FIG. 8 is comprised of transistors $Q_1$ (81) and $Q_2$ (82), and resistors $R_1$ (84), $R_2$ (85), $R_3$ (86), and $R_4$ (87). The circuit will produce an output in response to an AVT signal as illustrated in FIG. 9. At temperatures below $T_1$, where the AVT signal is small, all transistor devices of the circuit of FIG. 8 will be non-conducting, there will be no current flow through $R_5$ (86), and the output $V_{OUT}$ will be zero. As temperature and the AVT signal increase, both PNP devices, $Q_1$ and $Q_2$, will begin to conduct at temperatures above temperature $T_1$, $Q_2$ collector current will increase and the voltage drop across $R_5$ (86) will result in $V_{OUT}$ increasing. As temperature approaches a value $T_M$, the AVT signal will reach a level where $Q_1$ is conducting sufficient current through $R_2$ to cause NPN device $Q_3$ to begin to conduct. As $Q_3$ begins to conduct, it will shunt current from the emitter of $Q_2$, thus causing $Q_2$ collector current to begin to decrease, and causing $V_{OUT}$ to decrease proportionally. The $Q_2$ collector current will continue to decrease between temperatures $T_M$ and $T_2$ until transistor $Q_3$ conducts sufficient current to completely turn $Q_2$ off. This results in $V_{OUT}$ becoming zero at temperature $T_2$.

The temperature points, maximum signal, and ramp up and down slopes of the PPG 2 circuit may be controlled over a reasonable range by proper selection of the resistor values $R_1$ (84), $R_2$ (85), $R_3$ (86), and $R_4$ (87). The circuit of FIG. 8 thus meets the requirements for the generation of a PPG 2 signal as depicted in FIG. 5. An alternative circuit described in a co-pending patent application offers another possible means of implementing the PPG 2 function as required for the embodiment of the invention.

Key to the capability of the circuit of FIG. 3 to approximate any arbitrary correction signal is the discovery of an appropriate mathematical algorithm which allows the PPG 2 signal to be specified such that the approximation error can be made as small as desired. The use of a PPG 2 circuit capable of generating a "bounded parabolic" correction signal allows any number of new corrections to be added, without introducing any errors which degrade the accuracy of previous approximations. Thus, the approximation error can be made to approach zero with a sufficiently large number of PPG's 2, properly adjusted and summed into a composite correction signal.

The following heuristic proof is offered to demonstrate that an arbitrary continuous correction function f(T) can be approximated to any desired accuracy over a finite range of T by the appropriate number of properly chosen bounded parabolic functions. Given n bounded parabolic functions y(T), each with a shape as illustrated in FIG. 5 but where $T_1$, $T_2$ and A can be independently chosen for each function, the function f(T) is then to be approximated by the summation of n terms $$f(T) \approx y_1 0(T) + y_2(T) + \ldots + y_n(T)$$

The residual error after the $i^{th}$ approximation may be expressed as $$e(T) = f(T) - y_1(T) - y_2(T) - \ldots - y_i(T)$$

Figure 10:
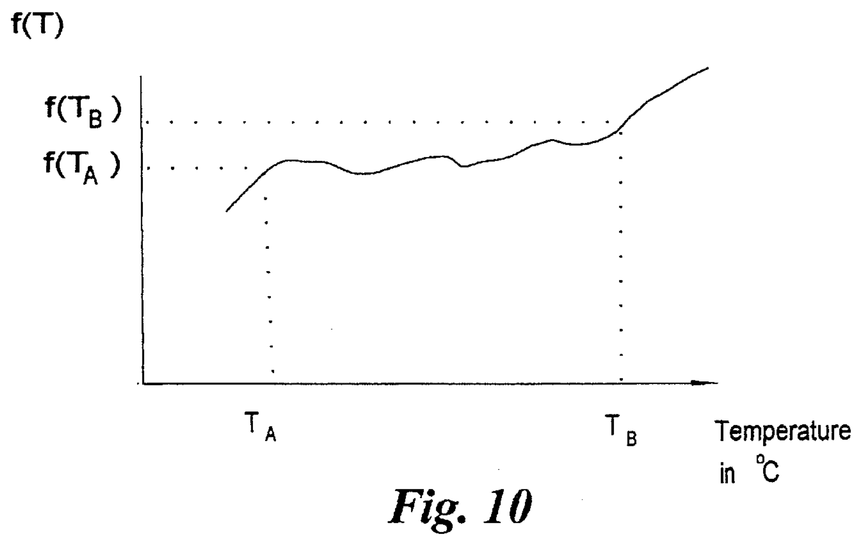
FIG. 10 shows a curve which represents of an arbitrary function f(T) to be approximated.
Figure 11:
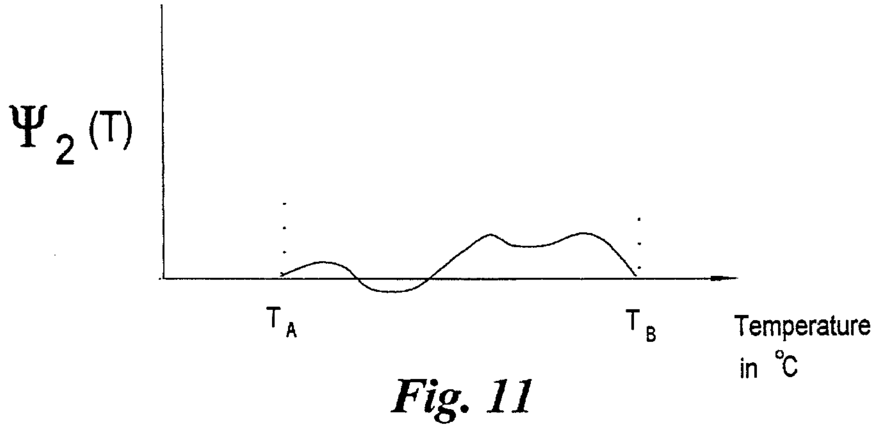
FIG. 11 shows the residual error of f(T) after two approximation iterations.
Figure 12:
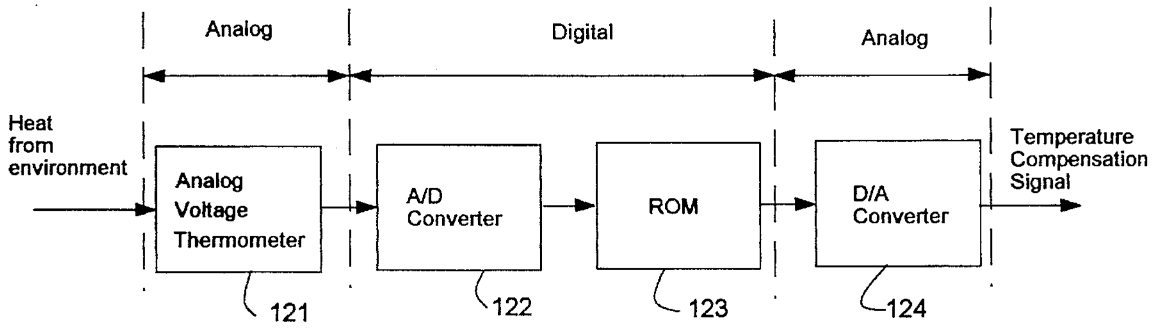
( Prior Art ) Fig. 12
FIG. 12 shows a block diagram of a mixed signal analog/digital temperature compensation system such as is known in the prior art.

FIG. 10 shows a function f(T) which is representative of an arbitrary function to be approximated between the temperatures $T_A$ and $T_B$. The value of f(T) at $T_A$ is designated $f(T_A)$ and the value at $T_B$ is designated $f(T_B)$. By choosing the first approximation function $y_1$ such that $T_{M1}=T_A$ and $A_1=f(T_A)$ it is possible to force the approximation error at $T_A$ to zero. Likewise by choosing the second approximation function $y_2$ properly the approximation error at $T_B$ can be forced to zero. That is, for $y_2$, $T_{M2}=T_B$ and $A_2=f(T_B)$. Thus, the residual error $e_2$ after the first two approximations will appear as shown in FIG. 11. It is clear that the residual error of FIG. 11 is of the form that it can be expressed as a series of bounded polynomials. We can say in general that we can always choose $y_1$ and $y_2$ to force $e_2$ to be of a form that can be expressed as a series of bounded polynomials. Each bounded polynomial of the residual error may be independently approximated by additional bounded polynomial functions. These approximations by their nature of being zero everywhere except in the temperature interval of interest, will have no effect on previous approximations. Since each approximation of a bounded polynomial p(T) by another bounded polynomial y(T) is bound to result in a residual error that is smaller than the original p(T), it follows that the approximation error can be made arbitrarily small.

It will be appreciated that although a specific embodiment of the invention has been described herein by way of illustration, the principles of the invention taught herein may be applied in other ways, and may use other circuit configurations, and that the generality of the invention disclosed is not limited to the specific embodiment described, but is defined instead by the claims which follow.

I claim:

1. An apparatus for producing a composite electrical signal output of arbitrary value having direct correspondence to an analog signal input, comprising:

one or more signal generating means, said signal generating means in turn comprising an input responsive to the analog signal such that an output signal is produced over a selectable range of the analog signal means for establishing a lower limit within the range of the analog signal below which the input is not responsive means for establishing an upper limit within the range of the analog signal, above which the input is not responsive means for selecting the polarity of the output signal means for establishing the magnitude of the output signal summing means, responsive to the plurality of signal generating means, for summing the outputs of the signal generating means.

2. An apparatus for producing an electrical signal having an arbitrary value corresponding directly to the values of an analog input signal, comprising:

a plurality of signal generating means, each of said means for producing an output over a selected range of the analog input signal and at no other parts of the range;

summing network means, responsive to the plurality of signal generating circuit means, for aggregating the effect of each signal shaping circuit into a single output signal.

3. An apparatus for producing an electrical signal having an arbitrary value corresponding directly to the values of an analog input signal, comprising:

signal shaping means, responsive to the analog input signal, for shaping the characteristics of the analog input signal to produce a shaped analog signal;

a plurality of signal generating means, each of which is for producing an output over a selected range of the analog input signal and at no other parts of the range;

summing network means, responsive to the plurality of signal generating circuit means, for aggregating the effect of each signal shaping circuit into a single output signal.

4. An apparatus for producing an electrical signal having an arbitrary value corresponding to the values of an analog input signal, comprising:

a plurality of signal generation circuits, each signal generation circuit in turn having an input which is responsive over a selectable range to the analog input signal an output for producing an output signal in response to the analog input signal means for establishing a limit below which the input is not responsive means for establishing a limit above which the input is not responsive means for selecting the magnitude of the output signal means for selecting the polarity of the output signal;

a summing network, responsive to the plurality of signal generation circuits, for aggregating the effect of each signal shaping circuit into a composite output signal.

5. The apparatus of claim 4 further comprising signal shaping means, responsive to the analog input signal, for shaping the characteristics of the analog input signal to produce a shaped analog signal, and wherein each of the signal generating means is responsive to the shaped analog signal.

6. An apparatus for producing an electrical signal having an arbitrary value corresponding to the values of an analog input signal, comprising:

a plurality of signal generation circuits, each signal generation circuit in turn having an input which is responsive over a selectable range to the analog input signal an output for producing an output signal in response to the analog input signal means for establishing a limit below which the input is not responsive means for establishing a limit above which the input is not responsive means for selecting the magnitude of the output signal means for selecting the polarity of the output signal;

a summing network, responsive to the plurality of signal shaping circuits, for aggregating the effect of each signal shaping circuit into a single output signal.

7. The apparatus of claim 6 further comprising signal shaping means, responsive to the analog input signal, for shaping the characteristics of the analog input signal to produce a shaped analog signal, and wherein each of the signal generating means is responsive to the shaped analog signal.

* * * * *

UNITED STATES PATENT AND TRADEMARK OFFICE
CERTIFICATE OF CORRECTION

PATENT NO. : 5,500,618

DATED : March 19, 1996

INVENTOR(S) : COMER, Donald T.

It is certified that error appears in the above-identified patent and that said Letters Patent are hereby corrected as shown below:

Title Page, item [73], Assignee: should read--
Oak Crystal, Inc.

Mt. Holly Springs, Pennsylvania

Signed and Sealed this

Seventh Day of September, 1999

*Attest:*

Q. TODD DICKINSON

*Attesting Officer* *Acting Commissioner of Patents and Trademarks*